(12) United States Patent
Gajendra et al.

(10) Patent No.: US 11,551,942 B2
(45) Date of Patent: Jan. 10, 2023

(54) METHODS AND APPARATUS FOR CLEANING A SUBSTRATE AFTER PROCESSING

(71) Applicant: APPLIED MATERIALS, INC., Santa Clara, CA (US)

(72) Inventors: Manoj A. Gajendra, Bangalore (IN); Kyle Moran Hanson, Kalispell, MT (US); Mahadev Joshi, Bangalore (IN); Arvind Thiyagarajan, Bengaluru (IN); Jon Christian Farr, Tempe, AZ (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 39 days.

(21) Appl. No.: 17/022,072

(22) Filed: Sep. 15, 2020

(65) Prior Publication Data

US 2022/0084843 A1 Mar. 17, 2022

(51) Int. Cl.
*H01L 21/67* (2006.01)
*H01L 21/02* (2006.01)
*H01L 21/3065* (2006.01)
*B08B 3/08* (2006.01)
(Continued)

(52) U.S. Cl.
CPC .......... *H01L 21/67051* (2013.01); *B08B 3/08* (2013.01); *H01L 21/02057* (2013.01); *H01L 21/3065* (2013.01); *H01L 21/67069* (2013.01); *H01L 21/67196* (2013.01); *H01L 21/67201* (2013.01); *H01L 21/67207* (2013.01);
(Continued)

(58) Field of Classification Search
CPC ......... H01L 21/67051; H01L 21/02057; H01L 21/3065; H01L 21/67069; H01L 21/67196; H01L 21/67201; H01L 21/67207; H01L 21/67742; H01L 21/68707; H01L 21/68764; H01L 21/67028; H01L 21/6719; B08B 3/08; B08B 3/022
USPC ............ 156/345.15, 345.17, 345.31, 345.32; 438/706, 710, 714, 748
See application file for complete search history.

(56) References Cited

U.S. PATENT DOCUMENTS 6,748,961 B2 6/2004 Treur
9,837,260 B2 * 12/2017 Inai ................... H01L 21/02057
2002/0045413 A1 4/2002 Sotozaki
(Continued)

FOREIGN PATENT DOCUMENTS

CN 102280372 B 12/2011
KR 20100054449 A 5/2010
KR 10-1116646 B1 3/2012

OTHER PUBLICATIONS

International Search Report for PCT/US2021/049208, dated Dec. 28, 2021.

*Primary Examiner* — Lan Vinh
(74) *Attorney, Agent, or Firm* — Moser Taboada (57) ABSTRACT

Methods and apparatus for removing substrate contamination are provided herein. In some embodiments, a multi-chamber processing apparatus includes: a processing chamber for processing a substrate; a factory interface (FI) coupled to the processing chamber via a load lock chamber disposed therebetween; and a cleaning chamber coupled to the FI and configured to rinse and to dry the substrate, wherein the cleaning chamber includes a chamber body defining an interior volume and having a first opening at an interface with the FI for transferring the substrate into and out of the interior volume.

17 Claims, 5 Drawing Sheets

(51) Int. Cl.
*H01L 21/677* (2006.01)
*H01L 21/687* (2006.01)

(52) U.S. Cl.
CPC .. *H01L 21/67742* (2013.01); *H01L 21/68707* (2013.01); *H01L 21/68764* (2013.01)

(56) References Cited

U.S. PATENT DOCUMENTS

| | | |
|---|---|---|
| 2002/0121290 A1 | 9/2002 | Tang et al. |
| 2004/0000324 A1 | 1/2004 | Masui et al. |
| 2006/0196527 A1 | 9/2006 | Nishimura et al. |
| 2007/0175759 A1* | 8/2007 | Klocke .................... C25D 7/12 204/471 |
| 2008/0093022 A1 | 4/2008 | Yilmaz et al. |
| 2008/0138917 A1* | 6/2008 | Verhaverbeke ..... H01L 21/6719 438/16 |
| 2011/0226626 A1* | 9/2011 | Choi ................. H01L 21/67028 205/93 |
| 2014/0290703 A1 | 10/2014 | Kobayashi et al. |
| 2016/0059274 A1* | 3/2016 | Miya .................... B08B 7/0021 134/95.3 |
| 2018/0114707 A1 | 4/2018 | Lim et al. |

* cited by examiner

METHODS AND APPARATUS FOR CLEANING A SUBSTRATE AFTER PROCESSING

FIELD

Embodiments of the present disclosure generally relate to substrate processing equipment.

BACKGROUND

In the field of semiconductor device fabrication, substrates may undergo a deposition or etch process to selectively add or remove material from the substrate. The addition or removal of material during the etch process may produce unwanted contamination, or residue, on surfaces of the substrate which can lead to defects in subsequent processing. The inventors have observed that conventional plasma-based cleaning processes were not adequate to remove the unwanted contamination.

Accordingly, the inventors have provided improved methods and apparatus removing contamination from a substrate after processing.

SUMMARY

Methods and apparatus for removing substrate contamination are provided herein. In some embodiments, a multi-chamber processing apparatus includes: a processing chamber for processing a substrate; a factory interface (FI) coupled to the processing chamber via a load lock chamber disposed therebetween; and a cleaning chamber coupled to the FI and configured to rinse and to dry the substrate, wherein the cleaning chamber includes a chamber body defining an interior volume and having a first opening at an interface with the FI for transferring the substrate into and out of the interior volume.

In some embodiments, a method of processing a substrate, includes: processing the substrate in a processing chamber; transferring the substrate from the processing chamber to a cleaning chamber within a queue period via a factory interface (FI), wherein a pressure in the FI is maintained greater than a pressure in the cleaning chamber to provide airflow from the FI to the cleaning chamber; and securing the substrate to a substrate support of the cleaning chamber, the cleaning chamber having a first opening at an interface with the FI for transferring the substrate into and out of the cleaning chamber and a second opening at the interface with the FI for providing airflow from the FI to the cleaning chamber.

In some embodiments, a method of processing a substrate, includes: processing the substrate in a processing chamber; transferring the substrate from the processing chamber to a cleaning chamber within a queue period via a factory interface (FI), wherein a pressure in the FI is maintained greater than a pressure in the cleaning chamber to provide airflow from the FI to the cleaning chamber; and securing the substrate to a substrate support of the cleaning chamber, the cleaning chamber having a first opening at an interface with the FI for transferring the substrate into and out of the cleaning chamber and a second opening at the interface with the FI for providing airflow from the FI to the cleaning chamber; moving at least one of an upper housing and a lower housing of the cleaning chamber into a closed position, defining a processing volume therebetween, wherein the upper housing includes the substrate support; rinsing the substrate by injecting liquid into the processing volume while rotating the substrate at a first rotation per minute (RPM) for a first period of time; washing the substrate by injecting liquid into the processing volume while rotating the substrate at a second RPM for a second period of time; and drying the substrate by rotating the substrate in the processing volume at a third RPM for a third period of time.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for removing substrate contamination after processing the substrate are provided herein. The inventors have observed that contamination on a substrate, for example, sidewall contamination, may be removed via a rinse, wash, and spin dry processes within a queue period post processing. The processing may be a deposition process, an etch process, or any other suitable process. In some embodiments, the queue time is about 30 minutes or less. In some embodiments, a cleaning chamber is configured to perform the rinse, wash, and spin dry processes within a single chamber. In some embodiments, the cleaning chamber is advantageously integrally coupled to a multi-chamber processing tool to clean the substrate within the queue period.

Figure 1:
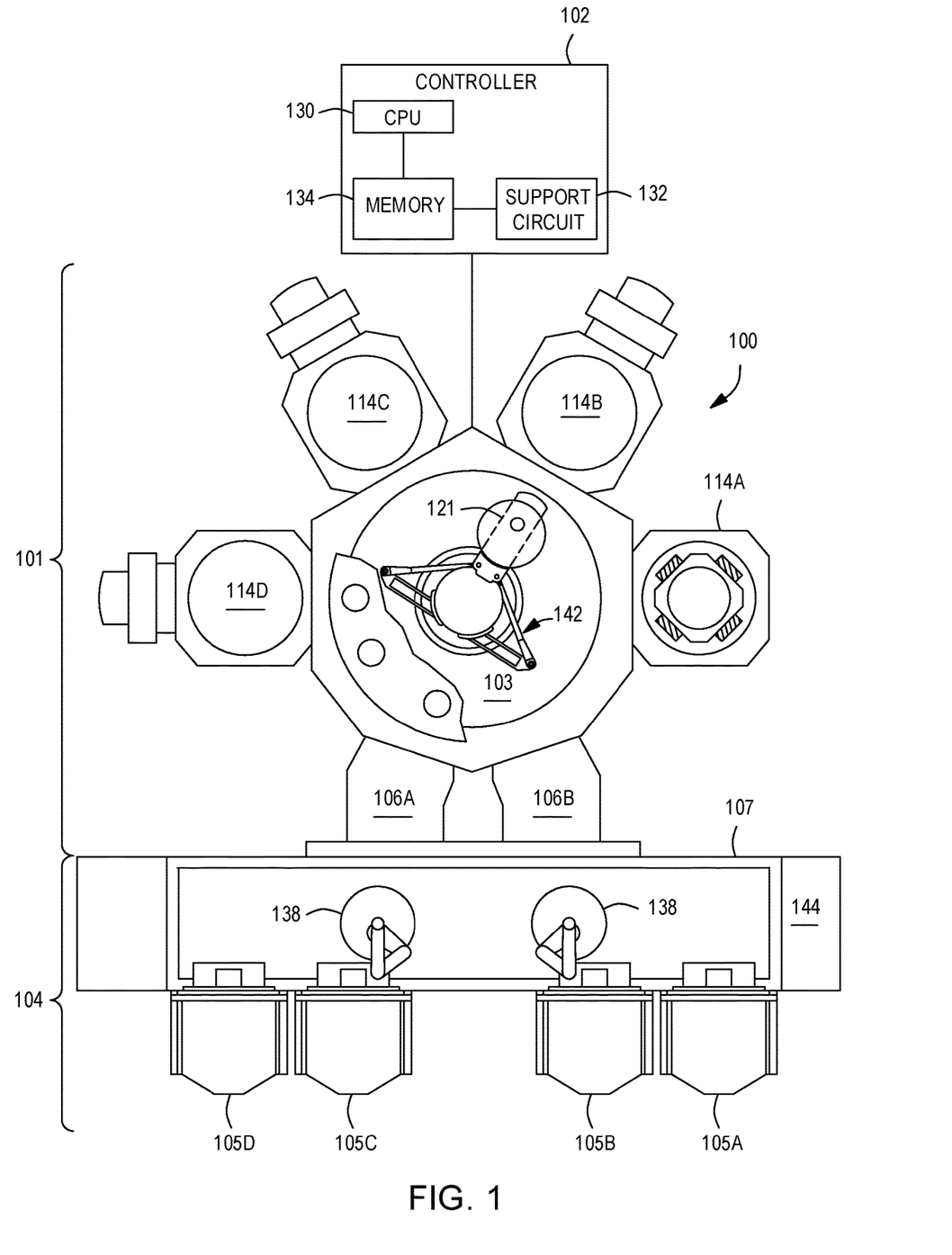
FIG. 1 depicts a multi-chamber processing tool 100 suitable to perform methods for processing a substrate in accordance with some embodiments of the present disclosure.

FIG. 1 depicts a multi-chamber processing tool 100 suitable to perform methods for processing a substrate in accordance with some embodiments of the present disclosure. Examples of the multi-chamber processing tool 100 include the CENTURA® and ENDURA® tools, all commercially available from Applied Materials, Inc., of Santa Clara, Calif. The methods described herein may be practiced using other multi-chamber processing tools having suitable process chambers coupled thereto, or in other suitable process chambers. For example, in some embodiments, the inventive methods discussed above may be advantageously performed in a multi-chamber processing tool such that there are limited or no vacuum breaks between processing steps. For example, reduced vacuum breaks may limit or prevent contamination of any substrates being processed in the multi-chamber processing tool. Other process chambers, including ones available from other manufacturers, may also be suitably used in connection with the teachings provided herein.

The multi-chamber processing tool 100 includes a processing platform 101 that is vacuum-tight, a factory interface (FI) 104, and a system controller 102. The processing platform 101 includes multiple processing chambers, such as 114A, 114B, 114C, and 114D, operatively coupled to a transfer chamber 103 that is under vacuum. The factory interface 104 is selectively operatively coupled to the transfer chamber 103 by one or more load lock chambers, such as 106A and 106B shown in FIG. 1.

In some embodiments, the factory interface 104 comprises at least one docking station 107 and at least one factory interface robot 138 to facilitate the transfer of the substrates. The at least one docking station 107 is configured to accept one or more front opening unified pod (FOUP). Four FOUPS, identified as 105A, 105B, 105C, and 105D, are shown in FIG. 1. The at least one factory interface robot 138 is configured to transfer the substrates from the factory interface 104 to the processing platform 101 through the load lock chambers 106A, 106B. Each of the load lock chambers 106A and 106B have a first port coupled to the factory interface 104 and a second port coupled to the transfer chamber 103. The load lock chambers 106A and 106B are coupled to a pressure control system (not shown) which pumps down and vents the load lock chambers 106A and 106B to facilitate passing the substrates between the vacuum environment of the transfer chamber 103 and the substantially ambient (e.g., atmospheric) environment of the factory interface 104.

The transfer chamber 103 has a vacuum robot 142 disposed therein. The vacuum robot 142 is capable of transferring a substrate 121 between the load lock chamber 106A and 106B and the processing chambers 114A, 114B, 114C, and 114D. In some embodiments, the vacuum robot 142 includes one or more upper arms that are rotatable about a respective shoulder axis. In some embodiments, the one or more upper arms are coupled to respective forearm and wrist members such that the vacuum robot 142 can extend into and retract from any processing chambers coupled to the transfer chamber 103.

The processing chambers 114A, 114B, 114C, and 114D, are coupled to the transfer chamber 103. Each of the processing chambers 114A, 114B, 114C, and 114D may comprise a chemical vapor deposition (CVD) chamber, an atomic layer deposition (ALD) chamber, a physical vapor deposition (PVD) chamber, a plasma enhanced atomic layer deposition (PEALD) chamber, and etch chamber (i.e., dry etch chamber) a preclean/annealing chamber, or the like. In some embodiments, at least one of the processing chambers 114A, 114B, 114C, and 114D is an etch chamber. The etch chamber may be any suitable processing chamber configured to perform a dry etch process by using plasmas or etchant gases to remove substrate material. For example, a dry etch process may comprise an aluminum oxide ($Al_2O_3$) etch, an aluminum chloride ($AlCl_3$) etch, or the like.

A cleaning chamber 144 is coupled to the factory interface 104 and configured to clean or remove contamination from the substrate 121 after being processed in one or more of processing chambers 114A, 114B, 114C, and 114D. For example, the vacuum robot 142 may transfer the substrate 121 from one of processing chambers 114A, 114B, 114C, and 114D to one of the load lock chambers 106A and 106B. One of the at least one factory interface robot 138 may transfer the substrate 121 from the load lock chamber 106A and 106B to the cleaning chamber 114. In some embodiments, the cleaning chamber 144 is coupled to the factory interface 104 on a side of the factory interface 104 different than the load lock chambers 106A and 106B and different than the FOUPS (e.g., 105A, 105B, 105C, and 105D). Once the substrate 121 is disposed in the cleaning chamber 144, the cleaning chamber 144 may perform to perform rinse, wash, and spin dry functions (described in more detail below) to remove contamination from the substrate 121, for example, sidewall contamination from a dry etch process.

The system controller 102 controls the operation of the multi-chamber processing tool 100 using a direct control of the cleaning chamber 144 and the process chambers 114A, 114B, 114C, and 114D or alternatively, by controlling the computers (or controllers) associated with the cleaning chamber 144 and the process chambers 114A, 114B, 114C, and 114D. The system controller 102 generally includes a central processing unit (CPU) 130, a memory 134, and a support circuit 132. The CPU 130 may be one of any form of a general-purpose computer processor that can be used in an industrial setting. The support circuit 132 is conventionally coupled to the CPU 130 and may comprise a cache, clock circuits, input/output subsystems, power supplies, and the like. Software routines, such as processing methods as described above may be stored in the memory 134 and, when executed by the CPU 130, transform the CPU 130 into a system controller 102. The software routines may also be stored and/or executed by a second controller (not shown) that is located remotely from the multi-chamber processing tool 100.

In operation, the system controller 102 enables data collection and feedback from the respective chambers and systems to optimize performance of the multi-chamber processing tool 100 and provides instructions to system components. For example, the memory 134 can be a non-transitory computer readable storage medium having instructions that when executed by the CPU 130 (or system controller 102) perform the methods described herein.

Figure 2:
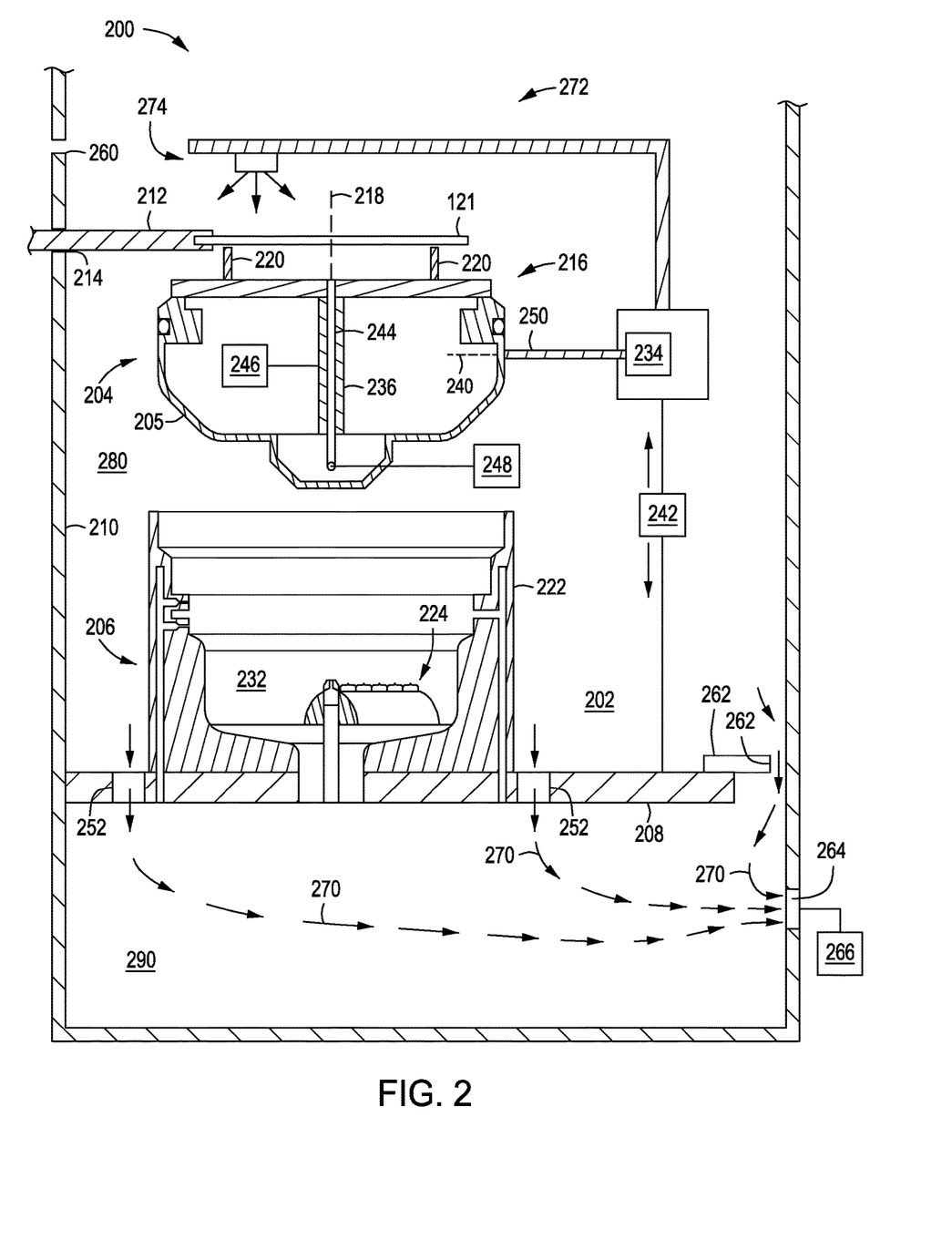
FIG. 2 depicts a cleaning chamber in a transfer position in accordance with some embodiments of the present disclosure.

FIG. 2 depicts a cleaning chamber 200 in a transfer position in accordance with some embodiments, of the present disclosure. The cleaning chamber 200 may be cleaning chamber 144. The cleaning chamber 200 generally has a chamber body 210 defines an interior volume 202 therein. In some embodiments, the cleaning chamber 200 includes a divider plate 208 disposed in the interior volume to define an upper compartment 280 and a lower compartment 290 of the cleaning chamber 200. The divider plate 208 includes a plurality of openings 252 to direct airflow 270 from the upper compartment 280 to the lower compartment 290. The chamber body 210 includes a pump port 264 coupled to a pump 266 to control a pressure of and evacuate gas from the interior volume 202. In some embodiments, the pump port 264 is disposed on a sidewall of the chamber body 210. In some embodiments, the pump port 264 is at the lower compartment 290. The pump port 264 may include a plurality of openings through the chamber body 210 (only one opening shown in FIG. 2).

In some embodiments, there are no other openings through the divider plate 208 except for the plurality of openings 252. In some embodiments, in addition to the plurality of openings 252, the divider plate 208 defines an airflow slot 268 between the divider plate 208 and a sidewall of the chamber body 210 to direct airflow 270 from the upper compartment 280 to the lower compartment 290. The airflow slot 269 may provide additional airflow between the upper compartment 280 and the lower compartment 290 to provide control of the pressure differential therebetween. In some embodiments, the divider plate 208 includes a tuning plate 262 coupled to the divider plate 208 to define the airflow slot 268 between the tuning plate 262 and the chamber body 210. In some embodiments, a size of the tuning plate 262 may be adjusted to adjust a width of the airflow slot 268. In some embodiments, the airflow slot 268 is about 3.0 mm to about 15.0 mm wide. In some embodiments, the airflow slot 268 is a rectangular slot that substantially extends a full length of the upper compartment 280.

The cleaning chamber 200 includes an upper housing 204 and a lower housing 206 both disposed within the interior volume 202. In some embodiments, the upper housing 204 and the lower housing 206 are disposed in the upper compartment 280. In some embodiments, the lower housing 206 is coupled to the divider plate 208. In some embodiments, the plurality of openings 252 are disposed proximate the lower housing 206. In some embodiments, the plurality of openings 252 comprise four openings disposed about the lower housing 206.

The upper housing 204 generally includes a body 205 and a substrate support 216 for securing the substrate 121 thereto. In some embodiments, the body 205 has a dome-like shape. The substrate support 216 includes a plurality of receiving fingers 220 for securing, clamping, or otherwise removably coupling the substrate 121 to the substrate support 216. In some embodiments, the plurality of receiving fingers 220 include a groove or slot for receiving an edge of the substrate 121. The substrate support 216 is rotatable with respect to a central axis 218 of the upper housing 204 to rinse, wash, or spin dry the substrate 121. In some embodiments, a top motor 246 is disposed in the upper housing 204 and coupled to the substrate support 216 via a support shaft 236. In some embodiments, the top motor 246 rotates the support shaft 236, the substrate support 216, and the substrate 121 secure thereto, with respect to the body 205, about the central axis 218 during at least one of the rinse, wash, or spin dry processes.

In some embodiments, the support shaft 236 includes a central channel 244 disposed therethrough. A purge gas supply 248 may be in fluidly coupled to the central channel 244 for passing a purge gas therethrough to a back surface of the substrate 121. The purge gas supply 248 may consist of an inert gas such as nitrogen gas, helium gas, argon gas, or the like.

The chamber body 210 includes a first opening 214 in a sidewall thereof at an interface with the factory interface 104 to facilitate transferring the substrate 121 into and out of the interior volume 202. For example, an end effector 212 of one of the at least one factory interface robot 138 may transfer the substrate 121 into the interior volume 202 and facilitate securing the substrate 121 to the upper housing 204. In some embodiments, in the transfer position as depicted in FIG. 2, the substrate 121 is oriented "face-up" through the first opening 214 before being secured to the upper housing 204 having the substrate support 216 in a "face-up" orientation. In some embodiments, in the transfer position, the substrate 121 may be oriented "face-down" through the first opening 214, before being secured to the upper housing 204, with the substrate support 216 in a "face-down" orientation. In some embodiments, the first opening 214 can accommodate the substrate 121 having a diameter of 200 mm, 300 mm, 450 mm, or the like.

In some embodiments, the chamber body 210 includes a second opening 260 or slot at the interface with the factory interface 104 for increased air circulation in the cleaning chamber 200. The second opening 260 advantageously ensures that there is no moisture trapped at a top of the interior volume 202, which can potentially get into the factory interface 104. In some embodiments, the second opening 260 is disposed vertically above the first opening 214. In some embodiments, the second opening 260 is sized similarly to the first opening 214. In some embodiments, the first opening 214 and the second opening 260 are fluidly coupled to the upper compartment 280.

The lower housing 206 includes a body 222 defining a processing volume 232 therein. In some embodiments, the lower housing 206 includes a plurality of nozzles 224 disposed in the processing volume 232. The plurality of nozzles 224 are configured to direct a liquid towards the upper housing 204 to rinse or wash the substrate 121 when clamped thereto (described in more detail below with respect to FIG. 3).

In some embodiments, a first motor 234 is coupled to the upper housing 204 via a support arm 240. The first motor 234 is configured to selectively rotate the upper housing 204 about an elongate axis 250 of the support arm 240 from the transfer position, where the substrate support 216 faces away from the lower housing 206 (i.e., "face-up" orientation), to a processing position (see FIGS. 4 and 5), where the substrate support 216 faces the lower housing 206 (i.e., "face-down" orientation). In some embodiments, a lift mechanism 242 is coupled to the support arm 240 for selectively raising or lowering the upper housing 204 with respect to the lower housing 206. The lift mechanism 242 may be a linear actuator, or the like. In some embodiments, the lift mechanism 242 is coupled to the upper housing 204 at one end and the divider plate 208 at another end.

In some embodiments, a swing arm 272 extends over the substrate support 216 and the substrate 121 secured thereto when the substrate support 216 is in the "face-up" orientation. In some embodiments, the swing arm 272 is coupled to the upper housing 204, as shown in FIG. 2. In some embodiments, the swing arm 272 is coupled to the divider plate 208. The swing arm 272 includes one or more nozzles 274 to spray one or more fluids to remove contaminants or moisture from the substrate 121. For example, the one or more nozzles 274 may spray a liquid, such as water, isopropanol (IPA), or the like. In another example, the one or more nozzles 274 may blow a gas, such as compressed dry air (CDA), nitrogen ($N_2$), or the like. In some embodiments, the one or more nozzles 274 comprise two tubes to blow any combination of fluid described above. The swing arm 272 may rotate or sweep across the substrate 121.

Figure 3:
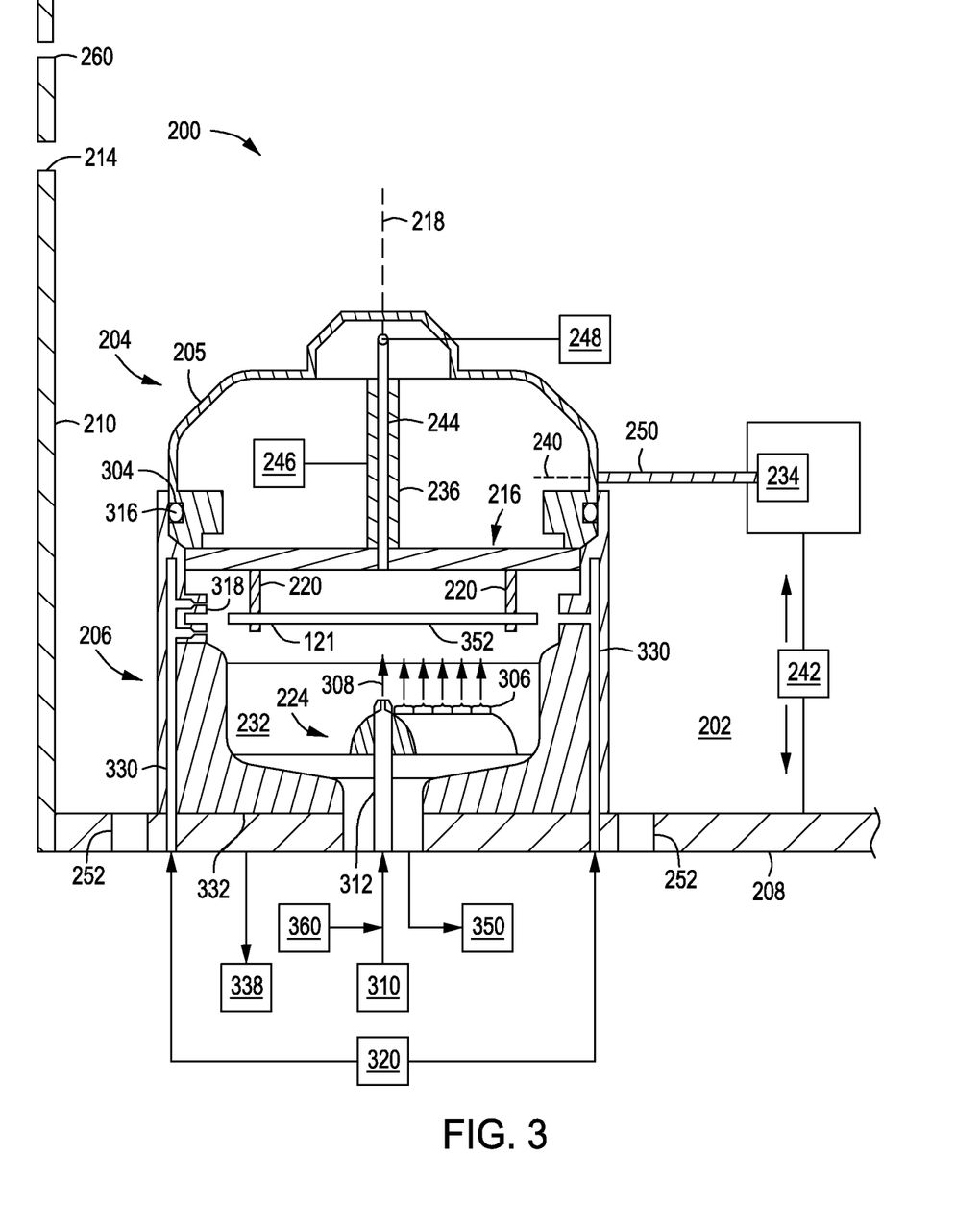
FIG. 3 depicts a cleaning chamber in a closed position in accordance with some embodiments of the present disclosure.

FIG. 3 depicts a cleaning chamber 200 in a closed position in accordance with some embodiments of the present disclosure. In the closed position, the substrate support 216 faces the lower housing 206 and the upper housing 204 is sealingly engaged with the lower housing 206, with the processing volume 232 therebetween. In some embodiments, the upper housing 204 includes an annular groove 304 for accommodating a seal member 316 configured to provide a seal between the upper housing 204 and the lower housing 206 when in the closed processing position. In some embodiments, the seal member 316 is a flexible tube that may be inflated to sealingly engage the lower housing 206 and the upper housing 204.

The cleaning chamber 200 includes a liquid source 310, for example, a water source, for supplying the liquid to the plurality of nozzles 224. In some embodiments, the plurality of nozzles 224 comprise an array of first nozzles 306 that are rotatable within the processing volume 232 of the lower housing 206 and configured to direct liquid 308 towards a front side 352 of the substrate 121 secured to the substrate support 216. In some embodiments, the liquid is water, deionized water, or the like. In some embodiments, the liquid directed at the substrate 121 is at a temperature of about 20 to 80 degrees Celsius.

In some embodiments, the plurality of nozzles 224 are coupled to a central shaft 312. In some embodiments, the central shaft 312 is hollow to provide a conduit from the liquid source 310 to the plurality of nozzles 224. In some embodiments, the plurality of nozzles 224 are a linear array of nozzles spanning radially outward from the central shaft 230. In some embodiments, the central shaft 312 is coupled to a second motor 360 to rotate the plurality of nozzles 224 about a central axis of the central shaft 312 within the processing volume 232.

In some embodiments, the lower housing 206 includes one or more side wash channels 330 extending from a bottom surface 332 of the lower housing 206 to one or more side wash nozzles 318 disposed in sidewalls of the lower housing 206. The one or more side wash nozzles 318 are configured to direct liquid radially inward towards sidewalls of the substrate 121. The one or more side wash channels 330 may be fluidly coupled to a second liquid source 320 or the liquid source 310. In some embodiments, the second liquid source 320 supplies the same liquid as the liquid source 310.

In some embodiments, the lower housing 206 includes a drain opening 302 extending from the processing volume 232 to the bottom surface 332 of the lower housing 206. The drain opening 302 is fluidly coupled to a drain 350 for evacuating the liquid from the processing volume 232. In some embodiments, a second pump 338 is fluidly coupled to the processing volume 232 to control a pressure of or evacuate gas from the processing volume 232. A pressure of the interior volume 202 is advantageously maintained equal to or less than a pressure within the factory interface 104 to minimize or prevent liquid or humid air from the cleaning chamber 200 from entering the factory interface 104. In some embodiments, a pressure in the lower compartment 290 is advantageously maintained equal to or less than a pressure in the upper compartment 280 to direct airflow from the upper compartment 280 to the lower compartment 290 and to minimize or prevent liquid or humid air from the cleaning chamber 200 from entering the factory interface 104.

Figure 4:
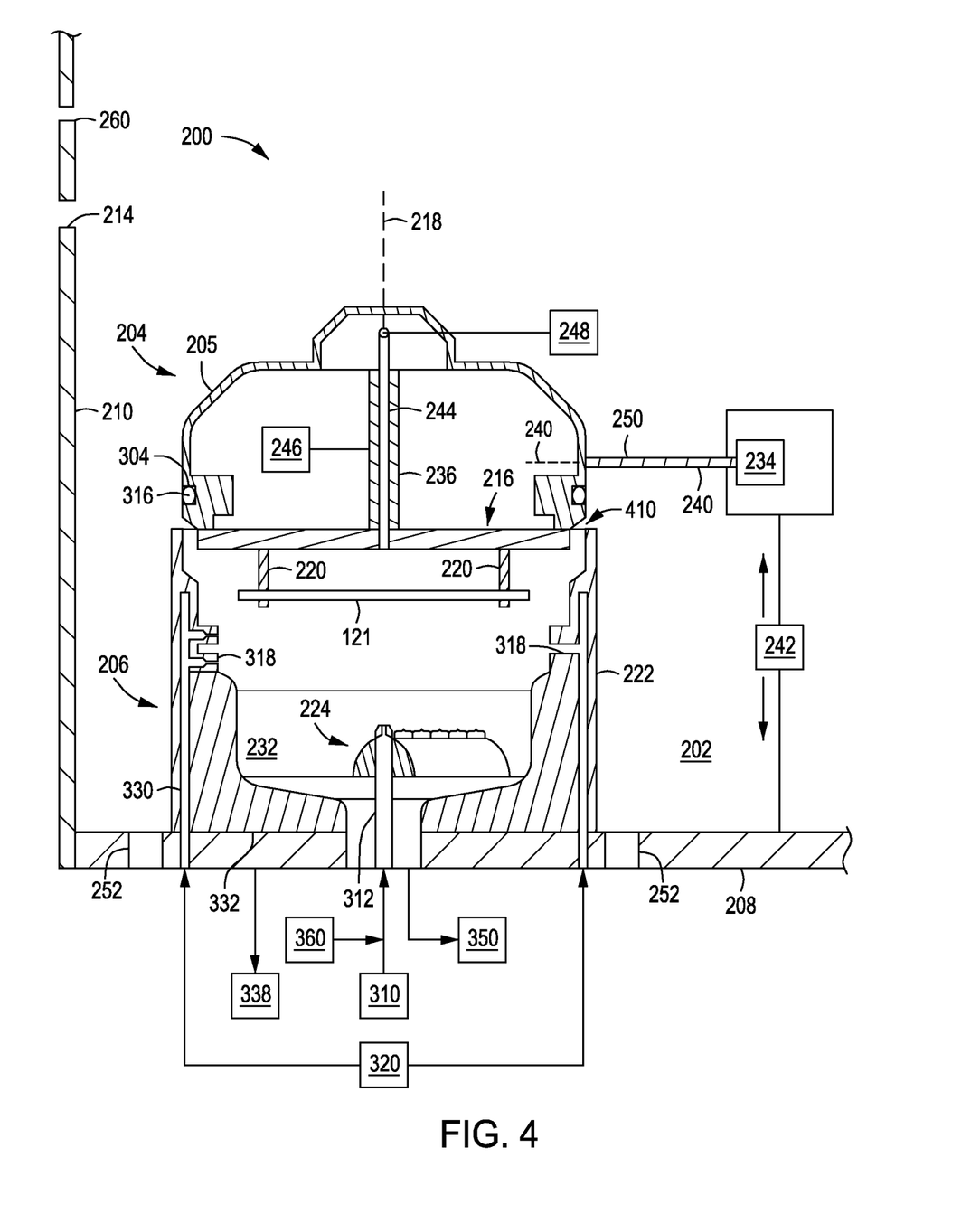
FIG. 4 depicts a cleaning chamber in a cracked position in accordance with some embodiments of the present disclosure.

FIG. 4 depicts a cleaning chamber 200 in a cracked position in accordance with some embodiments of the present disclosure. In the cracked position, the substrate support 216 faces the lower housing 206 with the upper housing 204 slightly spaced from the lower housing 206 with a gap 410 therebetween. In other words, in the cracked position, the lower housing 206 does not sealingly engage with the upper housing 204. In some embodiments, the lift mechanism 242 facilitates selectively maintaining the upper housing 204 in the closed position or the cracked position. In some embodiments, the lift mechanism 242 is coupled to the lower housing 206 to selectively maintain the upper housing 204 and the lower housing 206 in the closed position or the cracked position. In some embodiments, the spin dry process advantageously occurs in the cracked position so that dry air from the cleaning chamber 200 can displace the humid air from the processing volume 232 generated during the rinse and wash processes.

Figure 5:
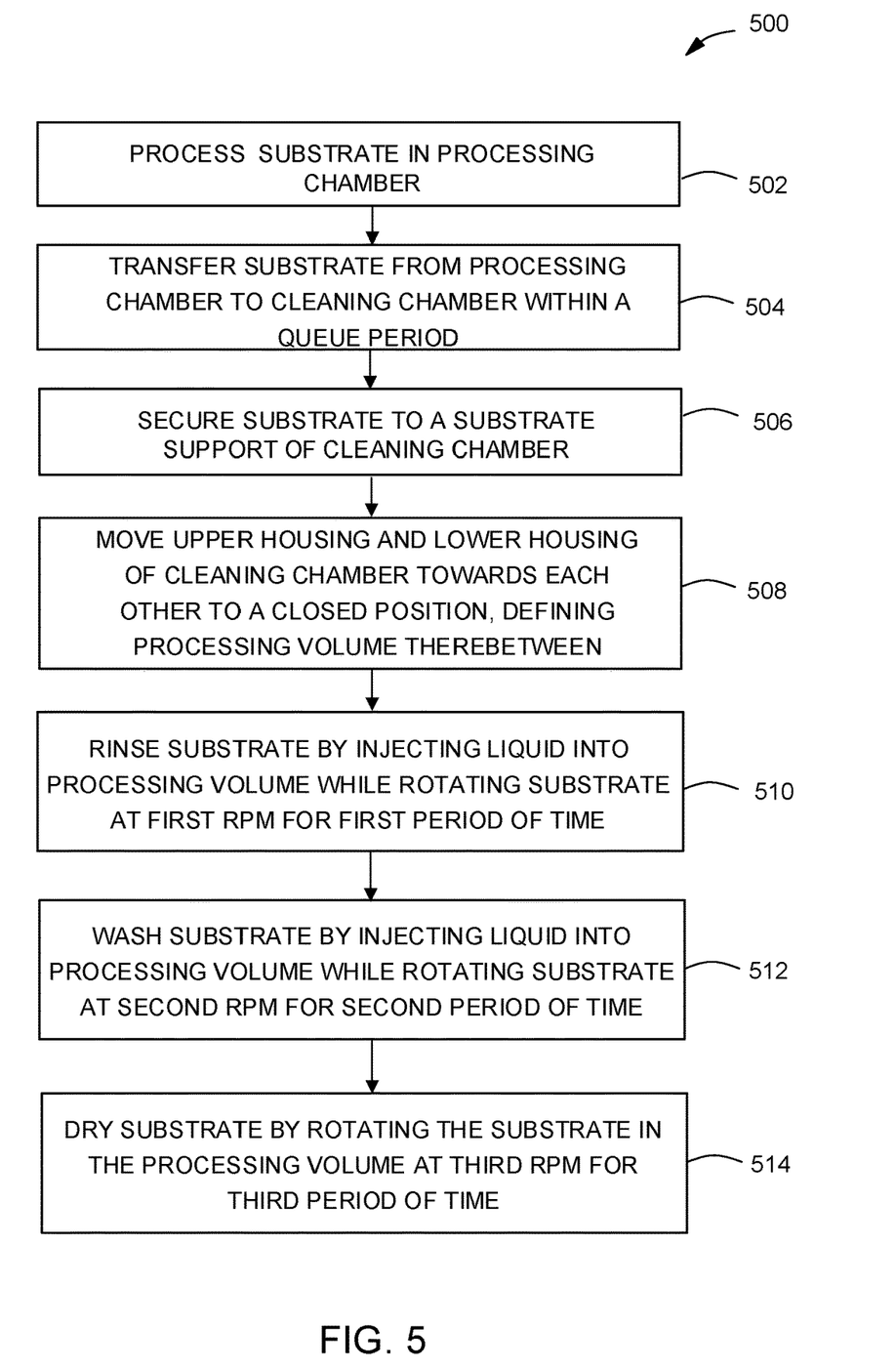
FIG. 5 depicts a method of processing a substrate in accordance with some embodiments of the present disclosure.

FIG. 5 depicts a method 500 of processing a substrate in accordance with some embodiments of the present disclosure. At 502, a substrate (e.g., substrate 121) is processed in a processing chamber (e.g., one of processing chambers 114A, 114B, 114C, and 114D) of a multi-chamber processing tool (e.g., multi-chamber processing tool 100). In some embodiments, the processing chamber is an etch chamber. In some embodiments, the processing chamber is an etch chamber for performing a dry etch process. In some embodiments, the processing chamber is a deposition chamber, such as a physical vapor deposition (PVD) chamber, chemical vapor deposition (CVD) chamber, atomic layer deposition (ALD) chamber, or the like.

At 504, the substrate is transferred from the processing chamber to a cleaning chamber (e.g., cleaning chamber 200) within a queue period via a factory interface (FI) (e.g., factory interface 104). A pressure in the FI is maintained greater than a pressure in the cleaning chamber to provide airflow from the FI to the cleaning chamber. In some embodiments, the queue period is less than 6 hours. In some embodiments, the queue period is advantageously about 2 minutes to about 30 minutes. In some embodiments, a load lock chamber (e.g., load lock chamber 106A and 106B) may be used as cooling chambers prior to transferring the substrate to the cleaning chamber. In some embodiments, the substrate is held in the cooling chamber for about 1 minute to about 5 minutes to cool the substrate prior to transferring to the cleaning chamber.

At 506, the substrate is secured to a substrate support (e.g., substrate support 216) of the cleaning chamber. In some embodiments, an upper housing (e.g., upper housing 204) of the cleaning chamber includes the substrate support. In some embodiments, the substrate is secured "face-up" onto the substrate support. In some embodiments, the substrate is secured "face-down" to the substrate support. In embodiments where the substrate is secured "face-up", after securing the substrate, the upper housing is rotated by approximately 180 degrees about an elongate axis (e.g., elongate axis 250) of a support arm (e.g. support arm 240) so that the substrate faces the lower housing of the cleaning chamber.

At 508, the upper housing and a lower housing (e.g., lower housing 206) of the cleaning chamber are moved towards each other to a closed position, defining a processing volume (e.g., processing volume 232) therebetween. In some embodiments, in the closed position, the upper housing is at least partially disposed within the lower housing.

At 510, the substrate is rinsed by injecting liquid into the processing volume while rotating the substrate at a first rotation per minute (RPM) for a first period of time. In some embodiments, the substrate is rinsed via at least one of the plurality of nozzles 224 or the plurality of side wash nozzles 318. In some embodiments, the first RPM is about 20 RPM to about 800 RPM.

In some embodiments, a seal (i.e., sealing member 316) disposed between the upper housing and the lower housing is inflated, concurrently while rinsing the substrate, to form a seal between the upper housing and the lower housing. In some embodiments, the seal disposed between the upper housing and the lower housing is inflated before rinsing the substrate to form the seal between the upper housing and the lower housing.

At 512, the substrate is washed by injecting liquid into the processing volume while rotating the substrate at a second RPM for a second period of time. In some embodiments, the second period of time is greater than the first period of time. In some embodiments, washing the substrate by injecting liquid comprises directing the liquid from the lower housing toward an exposed front side of the substrate and sidewalls of the substrate. In some embodiments, the substrate is washed via at least one of the plurality of nozzles 224 or the plurality of side wash nozzles 318. In some embodiments, the first period of time and the second period of time, together, is between about 10 seconds to about 300 seconds. In some embodiments the second RPM is about 300 RPM to about 1000 RPM. The plurality of nozzles 224 may rotate about the central shaft (e.g., central shaft 312) while the substrate is washed. A flow rate of the injected liquid may be greater while the substrate is washed that while the substrate is rinsed.

At 514, the substrate is dried by rotating the substrate in the processing volume at a third RPM for a third period of time. In some embodiments, the upper housing and the lower housing are positioned vertically away from each other into a cracked position prior to drying the substrate. In some embodiments, the third RPM is about 1000 RPM to about 1800 RPM. In some embodiments, the second RPM is greater than the first RPM, and the third RPM is greater than the first RPM and the second RPM. In some embodiments, the third period of time is about 30 seconds to about 180 seconds.

While the foregoing is directed to embodiments of the present disclosure, other and further embodiments of the disclosure may be devised without departing from the basic scope thereof.

The invention claimed is:

1. A multi-chamber processing apparatus, comprising:
    a processing chamber for processing a substrate;
    a factory interface (FI) coupled to the processing chamber via a load lock chamber disposed therebetween; and
    a cleaning chamber coupled to a side of the FI different than the processing chamber and configured to rinse and to dry the substrate, wherein the cleaning chamber includes:
    a chamber body defining an interior volume and having a first opening that extends to an inner volume of the FI for transferring the substrate into and out of the interior volume;
    an upper housing disposed in the interior volume and having a substrate support for securing a substrate thereto, wherein the substrate support is rotatable with respect to a central axis of the upper housing; and
    a lower housing disposed in the interior volume and having a plurality of nozzles for directing a liquid towards the upper housing to wash the substrate when clamped thereto and a drain.

2. The multi-chamber processing apparatus of claim 1, wherein the cleaning chamber includes a second opening at the interface with the FI for increased air circulation in the cleaning chamber.

3. The multi-chamber processing apparatus of claim 1, wherein the plurality of nozzles comprise at least one of:
    an array of first nozzles that are rotatable within the lower housing and configured to direct liquid towards the substrate support, or
    more side wash nozzles disposed in sidewalls of the lower housing and configured to direct liquid radially inward.

4. The multi-chamber processing apparatus of claim 1, wherein the upper housing includes an annular groove for accommodating a seal member configured to provide a seal between the upper housing and the lower housing when in a closed processing position.

5. The multi-chamber processing apparatus of claim 1, wherein the cleaning chamber includes a lift mechanism for selectively raising or lowering the upper housing with respect to the lower housing between a cracked processing position and a closed processing position.

6. The multi-chamber processing apparatus of claim 1, further comprising:
    a first front opening unified pod (FOUP) coupled to the FI and configured to provide one or more substrates to or from the multi-chamber processing apparatus;
    a transfer chamber in selective communication with the load lock chamber; and
    a factory interface robot disposed in the FI and configured to extend into the cleaning chamber to transfer substrates from the load lock chamber to the cleaning chamber.

7. The multi-chamber processing apparatus of claim 6, wherein the cleaning chamber is disposed on a side of the FI different than the FOUP and the load lock chamber.

8. The multi-chamber processing apparatus of claim 1, wherein the cleaning chamber includes a divider plate disposed in the interior volume to define an upper compartment and a lower compartment of the cleaning chamber, wherein the divider plate includes a plurality of openings to direct airflow from the upper compartment to the lower compartment.

9. The multi-chamber processing apparatus of claim 8, wherein the cleaning chamber includes a tuning plate coupled to the divider plate, wherein the tuning plate defines an airflow slot between the tuning plate and the chamber body.

10. The multi-chamber processing apparatus of claim 9, wherein the processing chamber is an etch chamber.

11. A multi-chamber processing apparatus, comprising:
    a processing chamber for processing a substrate;
    a factory interface (FI) coupled to the processing chamber via a load lock chamber disposed therebetween;
    a cleaning chamber coupled to the FI and configured to rinse and to dry the substrate, wherein the cleaning chamber includes:
    a chamber body defining an interior volume and having a first opening at an interface with the FI for transferring the substrate into and out of the interior volume,
    an upper housing disposed in the interior volume and having a substrate support for securing a substrate thereto, wherein the substrate support is rotatable with respect to a central axis of the upper housing; and
    a lower housing disposed in the interior volume and having a plurality of nozzles for directing a liquid towards the upper housing to wash the substrate when clamped thereto and a drain; and
    a first motor coupled to the upper housing, wherein the first motor is configured to selectively rotate the upper housing from a transfer position, where the substrate support faces away from the lower housing, to a processing position, where the substrate support faces the lower housing.

12. A method of processing a substrate, comprising:
    processing the substrate in a processing chamber of a multi-chamber processing tool;
    transferring the substrate from the processing chamber to a cleaning chamber within a queue period via a factory interface (FI), wherein a pressure in the FI is maintained greater than a pressure in the cleaning chamber to provide airflow from the FI to the cleaning chamber;

securing the substrate to a substrate support of the cleaning chamber, the cleaning chamber having a first opening at an interface with the FI for transferring the substrate into and out of the cleaning chamber and a second opening at the interface with the FI for providing airflow from the FI to the cleaning chamber;

moving at least one of an upper housing and a lower housing of the cleaning chamber into a closed position, defining a processing volume therebetween, wherein the upper housing includes the substrate support;

rinsing the substrate by injecting liquid into the processing volume while rotating the substrate at a first rotation per minute (RPM) for a first period of time, wherein a sealing member disposed between the upper housing and the lower housing is inflated, concurrently while rinsing the substrate, to form a seal between the upper housing and the lower housing;

washing the substrate by injecting liquid into the processing volume while rotating the substrate at a second RPM for a second period of time; and drying the substrate by rotating the substrate in the processing volume at a third RPM for a third period of time.

13. The method of claim 12, wherein the queue period is about 2 minutes to about 30 minutes.

14. The method of claim 12, wherein the first period of time and the second period of time, together, is between about 10 seconds to about 300 seconds.

15. The method of claim 12, wherein processing the substrate comprises performing an etch process.

16. The method of claim 12, further comprising, after securing the substrate, rotating the upper housing by approximately 180 degrees so that the substrate faces the lower housing of the cleaning chamber.

17. The method of claim 12, wherein the upper housing is positioned vertically away from the lower housing in a cracked position prior to drying the substrate.

* * * * *